United States Patent
Leddige et al.

(10) Patent No.: US 6,515,555 B2
(45) Date of Patent: Feb. 4, 2003

(54) MEMORY MODULE WITH PARALLEL STUB TRACES

(75) Inventors: Michael W. Leddige, Beaverton, OR (US); James A. McCall, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/746,241

(22) Filed: Dec. 22, 2000

(65) Prior Publication Data

US 2002/0079983 A1 Jun. 27, 2002

(51) Int. Cl.[7] ................................................ H01P 3/08
(52) U.S. Cl. ............................ 333/34; 333/246; 326/30
(58) Field of Search ..................... 333/34, 33; 326/30, 326/86, 90, 101

(56) References Cited

U.S. PATENT DOCUMENTS 5,315,182 A * 5/1994 Sakashita et al. ........... 257/207
5,426,405 A * 6/1995 Miller et al. ................ 257/726
6,067,594 A    5/2000 Perino et al.

FOREIGN PATENT DOCUMENTS

JP    4-360403    * 12/1992

* cited by examiner

Primary Examiner—Robert Pascal
Assistant Examiner—Joseph Chang
(74) Attorney, Agent, or Firm—Mark V. Seeley

(57) ABSTRACT

A printed circuit board is described. That printed circuit board includes a capacitive load that is coupled to a signal trace. The signal trace has a first section and a second section. The first section is positioned between the capacitive load and the second section. The second section has a first width, and the first section includes first and second lines that each have a width that is smaller than the first width.

20 Claims, 2 Drawing Sheets

MEMORY MODULE WITH PARALLEL STUB TRACES

FIELD OF THE INVENTION

The present invention relates to interconnects for printed circuit boards, particularly those that contain memory devices.

BACKGROUND OF THE INVENTION

Certain computer systems may employ a serial bus to transmit signals between a memory controller and memory. An example of such a serial bus has been defined by Rambus Corporation of Mountain View, California. That bus, often called the Direct Rambus memory channel, enables transmission of high speed, pipelined signals between a memory controller and memory. A memory card or module coupled to the bus may contain a number of high speed DRAMs, which have a Rambus developed architecture. Such memory devices are often called "Rambus DRAMs" or "RDRAMs."

The Direct Rambus memory channel requires signals to travel through all memory devices until terminated. Those memory devices add capacitance to the signal line, which lowers line impedance at those devices, when compared to the impedance of unloaded portions of the channel. That impedance discontinuity could adversely affect system performance, e.g., by requiring reduction in the maximum frequency at which high speed, pipelined electrical signals may be driven along the interconnect—to prevent signal reflection that may degrade signal quality.

To mitigate this effect, a design has been proposed in which the impedance of another portion of the signal line is raised to compensate for the reduced impedance at the memory devices. As shown in FIG. 1, which represents a printed circuit board ("PCB") that contains several memory devices, relatively short high impedance lines 1 may be placed between memory devices 2 and unloaded portions 3 and 4 of the signal trace. (Dashed box 5 serves to indicate that PCB 10 may include memory devices in addition to those shown, which may be mounted to both sides of PCB 10. PCB 10 may, for example, include 16 memory devices—8 on each side.) By adjusting the length of lines 1, the average impedance resulting from the combination of lines 1 and memory devices 2 can closely match the impedance of the unloaded portions of the channel (e.g., unloaded portions 3 and 4 on PCB 10 and unloaded portions that are located on a motherboard designed to receive PCB 10). When the average impedance that results from combining lines 1 and memory devices 2 is approximately equal to that of the unloaded portions of the channel, the portion of the signal trace that lies between points 6 and 7 may, for all practical purposes, be treated as an extension of unloaded portions 3 and 4.

To achieve an impedance match between the loaded and unloaded portions of a signal line, a certain amount of PCB surface area is required to accommodate the high impedance traces. To reduce the size of the PCB, it may be necessary to reduce the amount of PCB "real estate" that is allotted to those traces. Accordingly, there is a need for an improved PCB interconnect that enables an impedance match between the loaded and unloaded portions of the signal line while allocating less PCB surface area to the high impedance traces. The present invention provides such an interconnect.

DETAILED DESCRIPTION OF THE PRESENT INVENTION

A printed circuit board is described. That printed circuit board includes a capacitive load that is coupled to a signal trace. The signal trace has a first section and a second section. The first section is positioned between the capacitive load and the second section. The second section has a first width, and the first section includes first and second lines that each have a width that is smaller than the first width.

In the following description, numerous specific details are set forth such as component types, dimensions, etc., to provide a thorough understanding of the present invention. However, it will be apparent to those skilled in the art that the invention may be practiced in many ways other than those expressly described here. The invention is thus not limited by the specific details disclosed below.

Figure 1:
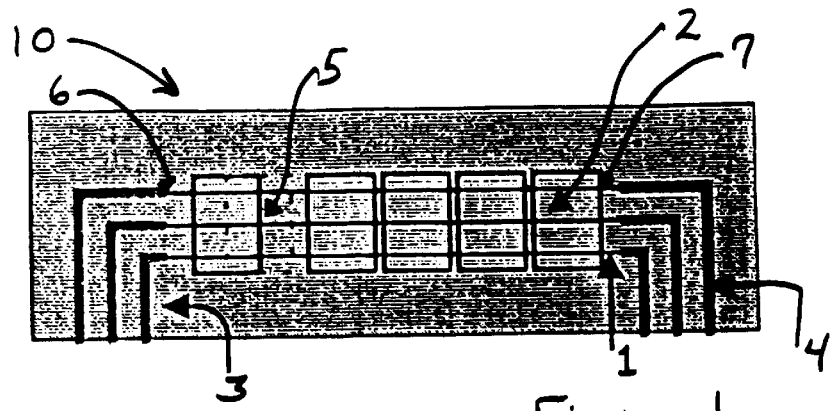
FIG. 1 illustrates a side view of a PCB that contains a number of memory devices.

FIG. 1 illustrates a PCB 10 that contains several memory devices 2. Those devices add capacitance to the signal trace. To match the average impedance of the loaded portion of the trace with the impedance of unloaded portions 3 and 4, high impedance lines 1 are formed between the memory devices and those unloaded portions. Lines 1 may provide an effective impedance of between about 45 and 65 ohms. By varying the length of lines 1, the average impedance resulting from the combination of those lines and the memory devices can match the impedance of unloaded portions 3 and 4, which may, for example, be about 28 ohms.

Figure 2A:
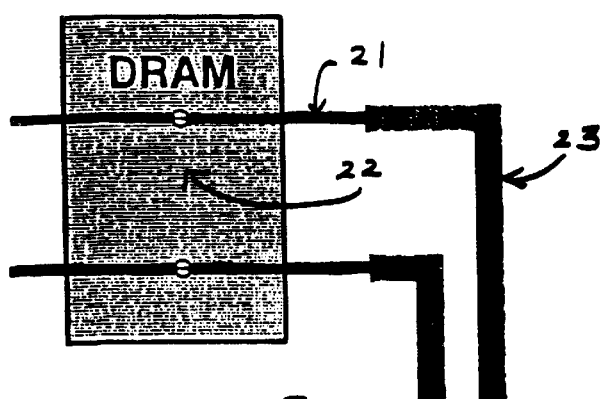
FIG. 2a represents an enlarged view of a section of the PCB of FIG. 1.

As mentioned above, it may be desirable to reduce the amount of PCB surface area that is allocated to the high impedance traces. To do so, the present invention replaces a single high impedance trace with a pair of tightly coupled traces that are not as thick as the single trace. Compare the current model, illustrated in FIG. 2a, with an embodiment of the present invention illustrated in FIG. 2b. In FIG. 2a, a single thin line 21 is positioned between memory device 22 and unloaded portion 23. The width and length of line 21 must be carefully chosen to ensure that the impedance of the loaded portion of the signal trace will closely match the impedance of the unloaded portions of the signal trace. A certain amount of PCB 10 real estate must be allocated to accommodate line 21. The PCB of the present invention reduces that amount by replacing single line 21 with two lines 210 and 220. As a consequence, the size of PCB 10 may be reduced while retaining impedance matching between the loaded and unloaded portions of the channel.

The PCB of the present invention thus includes a capacitive load, e.g., memory device 260, that is coupled to a signal trace. That signal trace includes first section 261 and second section 262—first section 261 being positioned between the capacitive load and second section 262. Second section 262 has a first width 263. First section 261 includes first and second lines 210 and 220—each having a width that is smaller than first width 263.

The degree to which lines 210 and 220 serve to reduce the amount of PCB surface area that is allocated to the high impedance traces depends upon the width of those lines and the amount of separation between them. In a preferred embodiment, a width and separation is chosen for lines 210 and 220 such that cumulative width 230 is less than the width that a single trace would require to have the same impedance. Such a result is feasible if lines 210 and 220 are tightly coupled. When those lines are tightly coupled, inductive effects will raise the effective impedance, which will balance the reduction in effective impedance that results from splitting line 21 into lines 210 and 220. As a result, the impedance of the combination of lines 210 and 220 can match the impedance of a thicker single line.

In a preferred embodiment of the present invention, the-width of unloaded portion 250 preferably should be between about 0.012 and about 0.020 inches. Lines 210 and 220 each preferably have a width that is less than or equal to about 0.006 inches, and more preferably have a width that is between about 0.002 inches and about 0.006 inches. Lines 210 and 220 should separate unloaded portion 250 from memory device 260 by a distance that ensures that the impedance of the loaded portion of the channel closely matches the impedance of the unloaded portion.

Figure 2B:
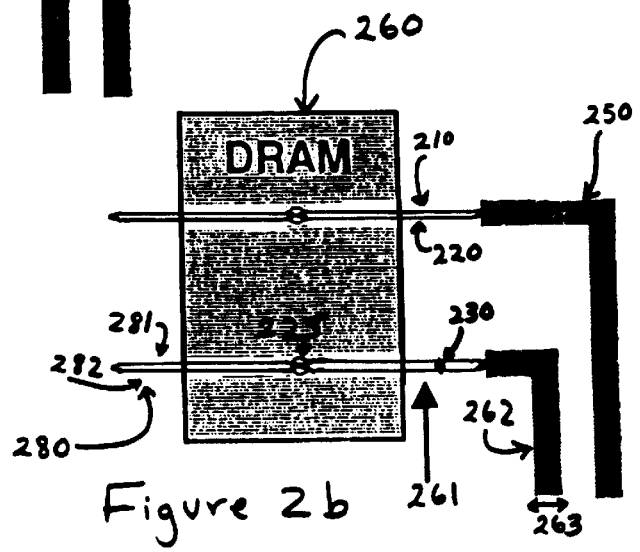
FIG. 2b represents an embodiment of the present invention as implemented in a PCB that contains a number of memory devices.

In the embodiment of the present invention illustrated in FIG. 2b, lines 210 and 220 have the same length and are formed in the same plane. Line 210 is oriented substantially parallel to line 220 such that line 210 separates memory device 260 from unloaded portion 250 by the same distance that line 220 separates memory device 260 from unloaded portion 250. In a preferred embodiment, line 210 is separated from line 220 by a distance that is less than or equal to about 0.005 inches. The closer these lines are placed together, the higher the mutual inductance effect, which increases the overall net inductance of both traces.

When selecting an appropriate length for lines 210 and 220 to increase the average impedance of the loaded portion of the channel, the signal delay that lines 210 and 220 introduce should be considered. A length should be chosen that does not add an unacceptable amount of electrical delay. In a preferred embodiment, the length chosen should ensure that the increased delay resulting from the combination of lines 210 and 220 and memory device 260 does not exceed one-half of the signal rise time ($T_R/2$)—even more preferably not exceeding one-third of the signal rise time ($T_R/3$). The effective impedance of first section 261 preferably is greater than about 40 ohms, and more preferably is greater than or equal to about 60 ohms.

A second memory device (not shown) may be coupled to memory device 260 by third section 280 of the signal trace. Third section 280 includes lines 281 and 282. Lines 281 and 282 have the same length, and preferably have the same width, and length, as lines 210 and 220. Lines 281 and 282, like lines 210 and 220, are preferably separated from each other by a distance that is less than or equal to about 0.005 inches. (Signals pass between memory device 260 and lines 210/220 or between memory device 260 and lines 281/282 through contact 225.)

Figure 3A:
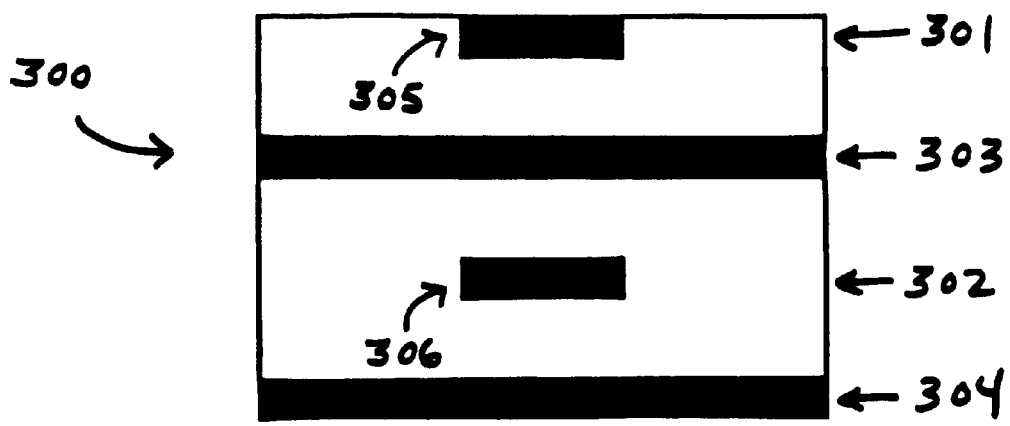
FIG. 3a represents a four layer PCB that has two signal routing layers and two layers that provide reference planes for the signal traces.

The present invention may also apply to signal lines that are routed along an internal PCB layer. FIG. 3a represents four layer PCB 300 that has two signal routing layers 301 and 302, and two layers 303 and 304 that provide reference planes for signal traces that are routed along layers 301 and 302, e.g., traces 305 and 306. Traces 305 and 306 may, for example, comprise high impedance traces, like trace 21 shown in FIG. 2a. FIG. 3a illustrates a cross-section of PCB 300 that is transverse to the routing of those traces.

To reduce-the PCB real estate that is required to accommodate the internal high impedance trace 306, the present invention replaces that trace with a pair of tightly coupled traces that are not as thick as the single trace. Unlike the embodiment described above in connection with. FIG. 2b, however, this embodiment of the present invention places each member of that pair of traces in a separate PCB layer rather than in the same PCB layer. By stacking the two traces vertically, their thicknesses may be reduced, which may reduce the amount of PCB space needed to make room for them.

Figure 3B:
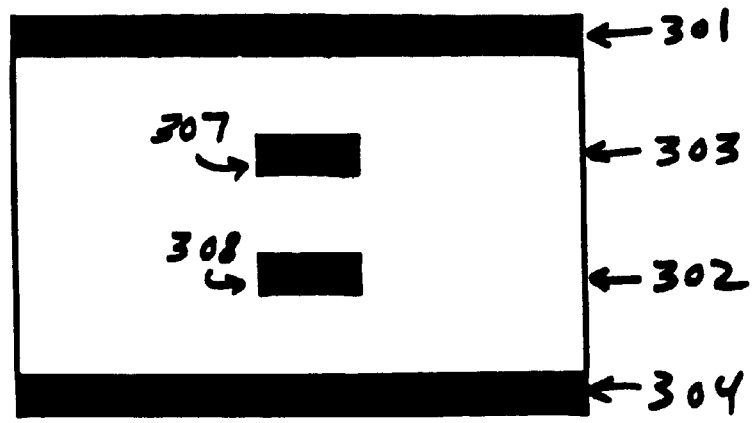
FIG. 3b represents a second embodiment of the present invention as applied to a signal line that is routed along an internal PCB layer.

FIG. 3b illustrates this second embodiment of the present invention. In this embodiment, trace 306 is replaced by traces 307 and 308. This pair of high impedance traces is located between a capacitive load and an unloaded portion of the signal line (not shown). The unloaded portion of the signal line may, for example, be routed along internal PCB layer 302. When it reaches the vicinity of a capacitive load, e.g., a memory device, the signal line then splits into trace 308, which also runs along layer 302, and trace 307, which runs along layer 303. (Trace 307 may contact the unloaded portion of the signal line through a via.) To enable single trace 306 to be replaced with a pair of traces 307 and 308, layer 303, which may provide a reference plane elsewhere on the PCB, must facilitate the routing of trace 307 in the vicinity of the capacitive load. To enable layer 303 to perform that function next to the capacitive load, layer 301, which may accommodate signal routing elsewhere on the PCB, must provide a reference plane for trace 307. Those skilled in the art will appreciate how to swap the functions that layers 301 and 303 must perform near the capacitive load from those they may perform at other PCB regions.

As shown in the figures, traces 307 and 308 are each thinner than trace 306. Preferably, traces 307 and 308 are each less than or equal to about 0.006 inches thick, and more preferably are between about 0.002 inches and about 0.006 inches thick. The distance separating traces 307 and 308 from each other, and the distances separating them from reference planes 301 and 304, respectively, preferably are between about 0.002 and about 0.007 inches. Those distances should be selected to ensure that the impedance resulting from the combination of traces 307 and 308, when balanced against the impedance reducing effect of the capacitive load, closely matches the impedance of the unloaded portion of the signal line. This embodiment of the present invention may thus give the desired impedance at the loaded portions of the signal line, while requiring less PCB space to do so. Although illustrated in the context of a four layer PCB, this embodiment of the present invention may apply to PCBs that have eight layers, or a different number of layers.

An improved PCB interconnect has been described. That interconnect relies on inductive coupling effects to enable routing of high impedance traces—between memory devices and unloaded portions of-a signal line—using less PCB real estate, while maintaining a close impedance match between loaded portions and unloaded portions of the signal line. In addition to memory containing PCBs, the interconnect of the present invention may apply to PCBs that include other types of capacitive loads. The interconnect of the present invention is not limited to memory cards, but may apply to other types of memory containing PCBs, including but not limited to computer motherboards. Although the Direct Rambus memory channel is identified as potentially benefiting from the interconnect of the present invention, this interconnect may be used with other types of memory channels that are capable of transmitting high speed, pipelined signals.

Features shown in the above referenced drawings are not intended to be drawn to scale, nor are they intended to be shown in precise positional relationship. Additional features that may be used with the above described interconnect have been omitted as they are not useful to explain aspects of the present invention. Although the foregoing description has specified an interconnect that includes certain features, those skilled in the art will appreciate that many modifications and substitutions may be made. Accordingly, it is intended that all such modifications, alterations, substitutions and additions be considered to fall within the spirit and scope of the invention as defined by the appended claims.

What is claimed is:

1. A printed circuit board comprising:
    a capacitive load that is coupled to a signal trace, the signal trace having:
        a first section and a second section,
        the first section positioned between the capacitive load and the second section,
        the second section having a first width, and
        the first section comprising first and second lines each having a width that is smaller than the first width;
        wherein the effective impedance of the first and second lines of the first section of the signal trace, taken in combination is at least about 12 ohms greater than the impedance of the second section of the signal trace; and
        wherein the average impedance resulting from the combination of the first and second lines and the capacitive load matches the impedance of the second section.

2. The printed circuit board of claim 1 wherein the first width is between about 0.012 and about 0.020 inches, and the first and second lines each have a width that is less than or equal to about 0.006 inches.

3. The printed circuit board of claim 2 wherein the first and second lines have substantially the same length and are formed in the same plane, and wherein the first line is oriented substantially parallel to the second line such that the first line separates the capacitive load from the second section of the trace by substantially the same distance that the second line separates the capacitive load from the second section of the trace.

4. The printed circuit board of claim 3 wherein the first line is separated from the second line by less than or equal to about 0.005 inches.

5. The printed circuit board of claim 4 wherein the capacitive load is a first memory device.

6. The printed circuit board of claim 5 further comprising a second memory device wherein the first memory device is coupled to the second memory device by a third section of the signal trace, the third section of the signal trace comprising third and fourth lines, the third line having substantially the same length as the fourth line, the third and fourth lines having substantially the same width as the first and second lines and wherein the third line is separated from the fourth line by less than or equal to about 0.005 inches.

7. The printed circuit board of claim 6 wherein the effective impedance of the first section is greater than about 40 ohms.

8. The printed circuit board of claim 7 wherein the effective impedance of the first section is greater than or equal to about 60 ohms.

9. The printed circuit board of claim 7 wherein the signal propagation delay introduced by the combination of the first section and the first memory device is less than or equal to about one-half of the signal rise time.

10. A memory module comprising:
    a first memory device;
    a second memory device;
    the first and second memory devices coupled to a signal trace, the signal trace having:
        a first section, a second section and a third section,
        the first section positioned between the first memory device and the second section,
        the second section having a first width,
        the first section comprising first and second lines each having a width that is smaller than the first width, and
        the third section positioned between the first memory device and the second memory device, the third section comprising third and fourth lines each having a width that is smaller than the first width;
        wherein the effective impedance of the first and second lines of the first section of the signal trace, taken in combination, is at least about 12 ohms greater than the impedance of the second section of the signal trace;
        wherein the effective impedance of the third and fourth lines of the third section of the signal trace, taken in combination, is at least about 12 ohms greater than the impedance of the second section of the signal trace; and
        wherein the average impedance resulting from the combination of the first, second, third and fourth lines and the first and second memory devices matches the impedance of the second section.

11. The memory module of claim 10 wherein the first width is between about 0.012 and about 0.020 inches, and the first, second, third and fourth lines each have a width that is less than or equal to about 0.006.

12. The memory module of claim 11 wherein the first line is separated from the second line by less than or equal to about 0.005 inches and the third line is separated from the fourth line by less than or equal to about 0.005 inches.

13. The memory module of claim 12 wherein the first line has substantially the same length as the second line and the third line has substantially the same length as the fourth line.

14. A memory card comprising:
    a first memory device;
    a second memory device;
    the first and second memory devices coupled to a signal trace, the signal trace having:
        a first section, a second section and a third section,
        the first section positioned between the first memory device and the second section,
        the second section having a first width,
        the first section comprising first and second lines each having a width that is smaller than the first width, the first line having substantially the same length as the second line, the first and second lines each having a width that is less than or equal to about 0.006 inches, and
        the third section positioned between the first memory device and the second memory device, the third section comprising third and fourth lines each having a width that is smaller than the first width, the third line having substantially the same length as the fourth line, the third and fourth lines each having a width that is less than or equal to about 0.006 inches;
        wherein the effective impedance of the first and second lines of the first section of the signal trace, taken in combination, is at least about 12 ohms greater than the impedance of the second section of the signal trace;

wherein the effective impedance of the third and fourth lines of the third section of the signal trace taken in combination, is at least about 12 ohms greater than the impedance of the second section of the signal trace; and wherein the average impedance resulting from the combination of the first, second, third and fourth lines and the first and second memory devices matches the impedance of the second section.

15. The memory card of claim 14 wherein the first line is separated from the second line by less than or equal to about 0.005 inches and the third line is separated from the fourth line by less than or equal to about 0.005 inches.

16. A printed circuit board comprising:
a capacitive load that is coupled to a signal trace, the signal trace having:
a first section and a second section,
the first section positioned between the capacitive load and the second section,
the second section having a first width and routed along a first layer, and
the first section comprising first and second lines each having a width that is smaller than the first width, the first line routed along the first layer and the second line routed along a second layer;
wherein the effective impedance of the first and second lines of the first section of the signal trace, taken in combination, is at least about 12 ohms greater than the impedance of the second section of the signal trace; and wherein the average impedance resulting from the combination of the first and second lines and the capacitive load matches the impedance of the second section.

17. The printed circuit board of claim 16 wherein the first and second lines each have a width that is less than or equal to about 0.006 inches.

18. The printed circuit board of claim 17 wherein the first and second lines have substantially the same length and wherein the first line is oriented substantially parallel to the second line in a vertical stacked relationship such that the first line separates the capacitive load from the second section of the trace by substantially the same distance that the second line separates the capacitive load from the second section of the trace.

19. The printed circuit board of claim 18 wherein the first line is separated from the second line by less than or equal to about 0.007 inches.

20. The printed circuit board of claim 19 further comprising a third layer that provides a reference plane for the first line and a fourth layer that provides a reference plane for the second line and wherein the first line is separated from the third layer by less than or equal to about 0.007 inches, and the second line is separated from the fourth layer by less than or equal to about 0.007 inches.

* * * * *